(12) United States Patent
Nam et al.

(10) Patent No.: US 9,681,501 B2
(45) Date of Patent: Jun. 13, 2017

(54) MULTI LAYER FOR ENCAPSULATION COMPRISING A PLANARIZING ORGANIC THIN LAYER AND A CONFORMAL ORGANIC THIN LAYER

(75) Inventors: Sangcheol Nam, Seoul (KR); Hoyoung Park, Seoul (KR); Yongchang Lim, Seoul (KR); Kichang Lee, Seoul (KR); Kyugil Choi, Seoul (KR); Hosung Hwang, Yongin-si (KR); Giback Park, Bucheon-si (KR); Jimin Kim, Seoul (KR)

(73) Assignee: Applied Materials, Inc., Santa Clara, CA (US)

( * ) Notice: Subject to any disclaimer, the term of this patent is extended or adjusted under 35 U.S.C. 154(b) by 245 days.

(21) Appl. No.: 12/809,539

(22) PCT Filed: Apr. 3, 2008

(86) PCT No.: PCT/KR2008/001881
§ 371 (c)(1),
(2), (4) Date: Jun. 18, 2010

(87) PCT Pub. No.: WO2009/082061
PCT Pub. Date: Jul. 2, 2009

(65) Prior Publication Data
US 2010/0272945 A1 Oct. 28, 2010

(30) Foreign Application Priority Data
Dec. 21, 2007 (KR) .................. 10-2007-0135017

(51) Int. Cl.
*B32B 3/00* (2006.01)
*H05B 33/04* (2006.01)
(Continued)

(52) U.S. Cl.
CPC ........... *H05B 33/04* (2013.01); *H01L 51/448* (2013.01); *H01L 51/5256* (2013.01);
(Continued)

(58) Field of Classification Search
CPC ... B32B 3/02; B32B 2250/03; B32B 2250/04; H01L 51/44; H01L 51/448;
(Continued)

(56) References Cited

U.S. PATENT DOCUMENTS

| 5,902,641 A | 5/1999 | Affinito et al. |
| 5,952,778 A | 9/1999 | Haskal et al. |

(Continued)

FOREIGN PATENT DOCUMENTS

| JP | 2003347045 A | 12/2003 |
| JP | 2005310803 A | 11/2005 |

(Continued)

OTHER PUBLICATIONS

ISA Korea, International Search Report of PCT/KR2008/001881, Sep. 10, 2008, 3 pages.

*Primary Examiner* — Joanna Pleszczynska
(74) *Attorney, Agent, or Firm* — Pillsbury Winthrop Shaw Pittman LLP

(57) ABSTRACT

A multi layer encapsulating film includes at least one planarizing organic thin film, at least one conformal organic thin film, and at least one inorganic thin film. The thin films are laminated in order of (a) a planarizing organic thin film, an inorganic thin film, a conformal organic thin film, and an inorganic thin film, (b) a conformal organic thin film, an inorganic thin film, a planarizing organic thin film, and an inorganic thin film, (c) a planarizing organic thin film, a conformal organic thin film, and an inorganic thin film, or (d) a conformal organic thin film, a planarizing organic thin film, and an inorganic thin film. The multi layer encapsu- (Continued)

lating film according to the invention can improve the surface roughness by using the planarizing organic thin film, and can enable particles to uniformly cover the device by using the conformal organic thin film.

13 Claims, 4 Drawing Sheets

(51) Int. Cl.
  *H01L 51/44* (2006.01)
  *H01L 51/52* (2006.01)
  *H01M 2/02* (2006.01)
(52) U.S. Cl.
  CPC .......... *H01M 2/0287* (2013.01); *Y02E 10/549* (2013.01); *Y10T 428/239* (2015.01)
(58) Field of Classification Search
  CPC ............. H01L 51/5253; H01L 23/3107; H01L 31/0203; H01L 31/0216–31/02168; H01L 21/00; H05B 33/04
  USPC ... 428/76, 414, 425.5, 425.9, 451, 212–220, 428/515, 688, 698, 702; 257/787, 788, 257/790, 793; 313/506, 509, 512
  See application file for complete search history.

(56) References Cited

U.S. PATENT DOCUMENTS

| | | | |
|---|---|---|---|
| 6,146,225 A | 11/2000 | Sheats et al. | |
| 6,268,695 B1 | 7/2001 | Affinito | |
| 6,379,743 B1 | 4/2002 | Lee et al. | |
| 6,570,325 B2 | 5/2003 | Graff et al. | |
| 6,765,351 B2* | 7/2004 | Forrest et al. | 313/506 |
| 6,835,950 B2* | 12/2004 | Brown et al. | 257/40 |
| 6,836,070 B2* | 12/2004 | Chung et al. | 313/512 |
| 6,911,667 B2* | 6/2005 | Pichler et al. | 257/40 |
| 6,923,702 B2* | 8/2005 | Graff et al. | 445/24 |
| 7,002,294 B2* | 2/2006 | Forrest et al. | 313/506 |
| 7,077,935 B2* | 7/2006 | Ziegler et al. | 204/192.14 |
| 2003/0205845 A1* | 11/2003 | Pichler et al. | 264/272.11 |
| 2005/0053719 A1 | 3/2005 | Ishida | |
| 2005/0202646 A1* | 9/2005 | Burrows et al. | 438/396 |

FOREIGN PATENT DOCUMENTS

| | | |
|---|---|---|
| JP | 2007273366 A | 10/2007 |
| KR | 100236011 | 9/1999 |
| KR | 1020030082256 | 10/2003 |
| KR | 1020070049942 | 5/2007 |

* cited by examiner

MULTI LAYER FOR ENCAPSULATION COMPRISING A PLANARIZING ORGANIC THIN LAYER AND A CONFORMAL ORGANIC THIN LAYER

TECHNICAL FIELD

The present invention relates to a multi layer encapsulated film having excellent oxygen and moisture barrier properties which is adapted to be used in displays, such as OLED (Organic Light-Emitting Device) and FOLED (Flexible Organic Light-Emitting Device), or batteries, such as thin film batteries and solar cells.

BACKGROUND ART

In general, to seal a device using a thin film, a multi layer encapsulated film is manufactured by alternately laminating organic and inorganic materials on the device. FIG. 1 shows the construction of a multi layer encapsulated film that is manufactured by alternately laminating a planarizing organic thin film and an inorganic thin film according to the related art. FIG. 2 shows the construction of a multi layer encapsulated film that is manufactured by alternately laminating a conformal organic thin film and an inorganic thin film.

In case of the multi layer encapsulated film manufactured in this manner, the organic thin film serves to absorb stress and uniformize surface roughness when an inorganic thin film serving as a barrier against oxygen and moisture is formed, such that the inorganic thin film is uniformly formed.

U.S. Pat. No. 6,570,325 discloses a planarizing film that is used as an organic thin film attached to the upper portion of the device. This organic thin film reduces defects in the substrate to improve surface roughness and enables particles on the upper portion of the device to cover the device, thereby improving the characteristics of the inorganic thin film.

As disclosed in U.S. Pat. No. 5,902,641, for example, a liquid monomer is evaporated by a heat source to be then formed on the upper portion of the device, and then subjected to a phase change of the liquid monomer to a solid phase and polymerization by UV curing, thereby manufacturing the planarizing organic thin film.

The planarizing organic thin film can reduce the defects of the substrate to improve surface roughness and can enable the particles to cover the device. However, as shown in FIG. 3, when the device is covered with the particles, the liquid monomer may gravitate to a portion having a comparatively wide surface area, which makes it impossible to uniformly form the planarizing organic thin film. For this reason, when one kind of organic thin film and an inorganic thin film are alternately formed (FIG. 1), as shown in FIG. 3, it may be difficult to control the amount of permeation of moisture and oxygen through the particles.

Meanwhile, unlike the planarizing organic thin film, when a conformal organic thin film is only used, as shown in FIG. 4, satisfactory step coverage is achieved, and thus a satisfactory barrier property is obtained in view of the device or the particles. In this case, however, it may be difficult to prevent the substrate from being scratched and to uniformize the surface roughness. Accordingly, when one kind of organic thin film and an inorganic thin film are alternately formed (FIG. 2), there is a problem in that it is difficult to control the amount of permeation of oxygen and moisture. This problem is caused because a raw material of a liquid phase, a solid-liquid phase, or a solid phase is vaporized during the phase change by a heat source, and a film is formed in a vapor phase on the substrate having mounted thereon the device, thereby forming a conformal organic film.

As described above, the known multi layer encapsulated film that is manufactured by alternately forming either the planarizing organic film or the conformal organic film and the inorganic film at the top of the device (FIGS. 1 and 2) has merits and demerits according to the intrinsic characteristics of the used organic thin film. For this reason, the known multi layer encapsulated film cannot exert a satisfactory device protection function.

DISCLOSURE

Technical Problem

The invention has been finalized in order to solve the drawbacks inherent in the related art, and it is an object of the invention to provide a multi layer encapsulated film that has organic thin films capable of improving surface roughness and enabling particles to uniformly cover a device, such that inorganic thin films to be laminated on the organic thin films can have excellent barrier properties against oxygen and moisture.

Technical Solution

According to an aspect of the invention, a multi layer encapsulated film includes at least one planarizing organic thin film, at least one conformal organic thin film, and at least one inorganic thin film. The thin films are laminated in order of (a) a planarizing organic thin film, an inorganic thin film, a conformal organic thin film, and an inorganic thin film; (b) a conformal organic thin film, an inorganic thin film, a planarizing organic thin film, and an inorganic thin film; (c) a planarizing organic thin film, a conformal organic thin film, and an inorganic thin film; or (d) a conformal organic thin film, a planarizing organic thin film, and an inorganic thin film.

Advantageous Effects

The multi layer encapsulated film according to the aspect of the invention can improve the surface roughness by using the planarizing organic thin film, and enable particles to uniformly cover the device by using the conformal organic thin film. Therefore, the inorganic thin films to be laminated on the organic thin films can have excel lent barrier properties against oxygen and moisture.

BEST MODE

Figure 1:
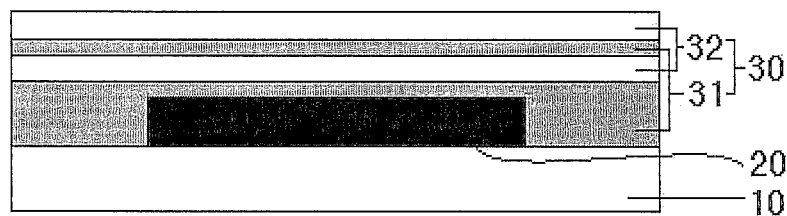
FIG. 1 is a diagram showing a known multi layer encapsulated film that is manufactured by alternately laminating a planarizing organic thin film 31 and an inorganic thin film 32.
Figure 2:
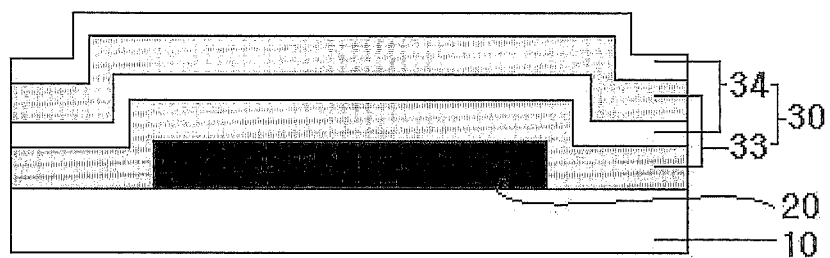
FIG. 2 is a diagram showing a known multi layer encapsulated film that is manufactured by alternately laminating a conformal organic thin film 33 and an inorganic thin film 34.
Figure 3:
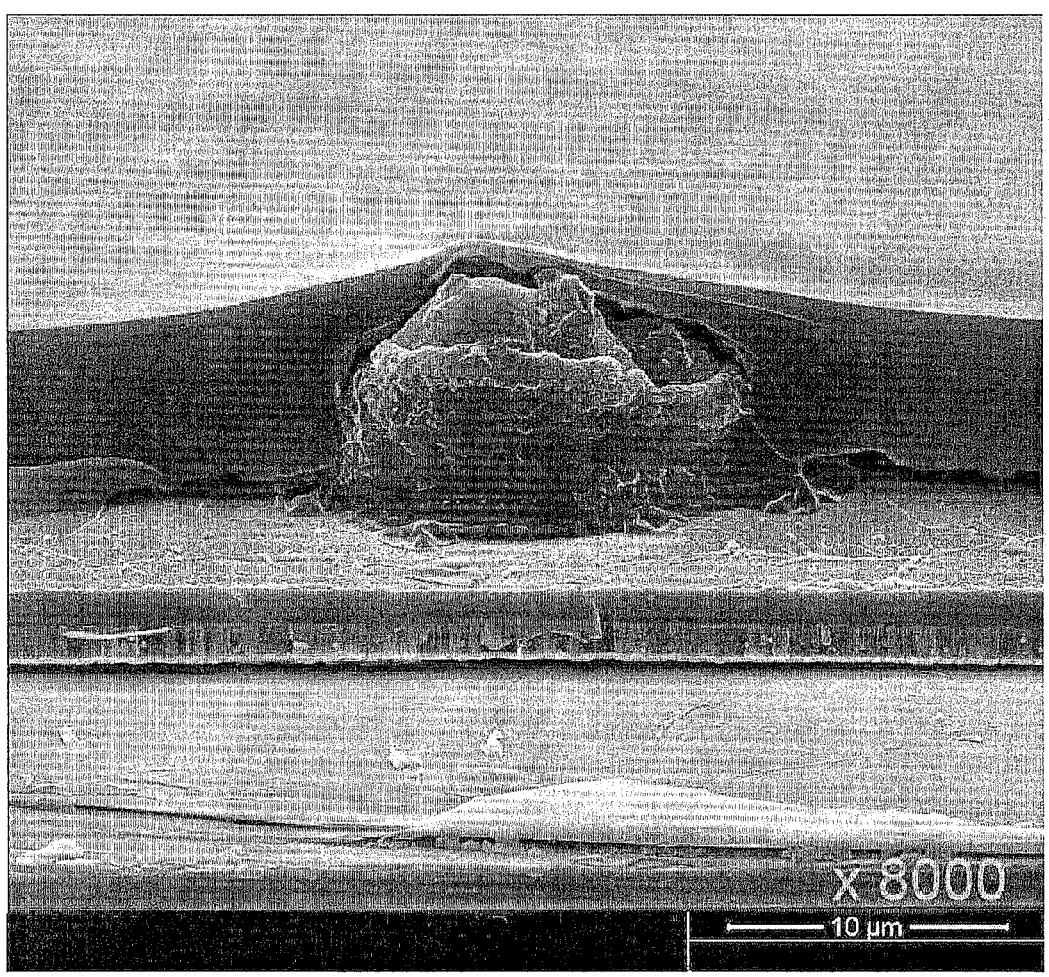
FIG. 3 is an SEM photograph showing a state where a planarizing organic thin film is laminated.
Figure 4:
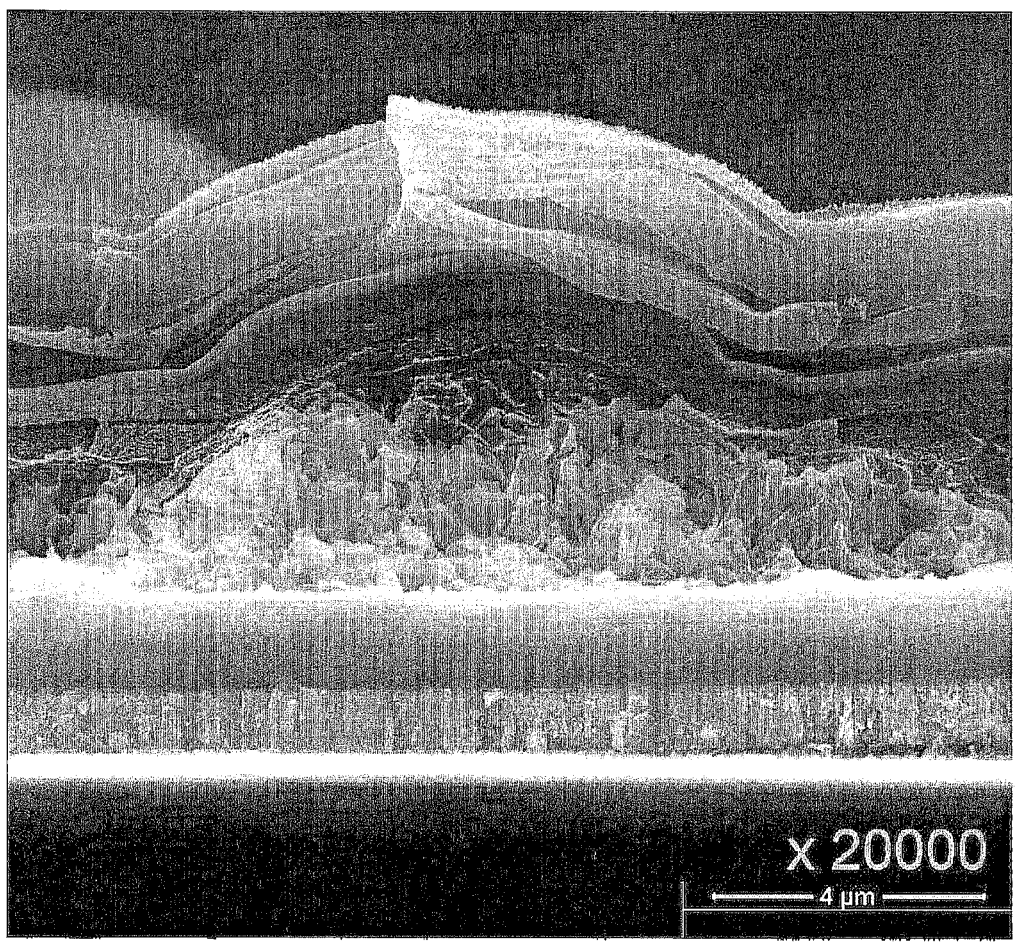
FIG. 4 is an SEM photograph showing a state where a conformal organic thin film is laminated.

Embodiments of the invention provide a multi layer encapsulated film including at least one planarizing organic thin film, at least one conformal organic thin film, and at least one inorganic thin film. The thin films are laminated in order of (a) a planarizing organic thin film, an inorganic thin film, a conformal organic thin film, and an inorganic thin film; (b) a conformal organic thin film, an inorganic thin film, a planarizing organic thin film, and an inorganic thin film; (c) a planarizing organic thin film, a conformal organic thin film, and an inorganic thin film; or (d) a conformal organic thin film, a planarizing organic thin film, and an inorganic thin film.

To improve sealing performance, at least one planarizing organic thin film or at least one two-layered thin film having a conformal organic thin film and an inorganic thin film in that order may be further laminated on the outermost inorganic thin film in (a) and (b).

To improve sealing performance, at least one three-layered thin film having a planarizing organic thin film, a conformal organic thin film, and an inorganic thin film in that order, or at least one three-layered thin film having a conformal organic thin film, a planarizing organic thin film, and an inorganic thin film in that order may be further laminated on the inorganic thin film in (c) and (d).

To improve sealing performance, at least one planarizing organic thin film or at least one two-layered thin film having a conformal organic thin film and an inorganic thin film may be further laminated on the inorganic thin film in (c) and (d).

When two or more kinds of inorganic thin films are used for the multi layer encapsulated film according to an embodiment of the invention, the inorganic thin films may be made of the same kind of inorganic thin film or two or more kinds of different inorganic thin films. In addition, when two or more kinds of planarizing organic thin films are used for the multi layer encapsulated film according to an embodiment of the invention, the organic thin films may be made of the same kind of planarizing organic thin film or two or more kinds of different planarizing organic thin films. The same is applied to a case in which two or more kinds of conformal organic thin films are used for the multi layer encapsulated film according to an embodiment of the invention. The terms "same" and "different" are concepts representing the kinds of thin films according to different materials or lamination methods. According to the invention, the planarizing organic thin films and the organic thin films have different characteristics according to intrinsic characteristics of organic materials and polymerization methods for polymerizing monomers of the organic materials. Accordingly, the known materials for the organic thin films may be unlimitedly used as the materials for the planarizing organic thin films and the conformal organic thin films. For example, for the planarizing organic thin film, transparent liquid monomers or transparent gel-like monomers that are formed by evaporation, silk screen, or coating and polymerized by ultraviolet rays or visible rays may be exemplified. In particular, diazo resins, azide resins, acrylic resins, polyamide resins, polyester resins, epoxide resins, polyether resins, urethane resins, and the like may be exemplified. These materials may be used individually or two or more of them may be used in combination.

For the conformal organic thin film, thermopolymerizable materials, such as polystyrene resins, acrylic resins, urea resins, isocyanate resins, xylene resins, and the like, in which radicals are generated when monomers are heated to start reactions, may be exemplified. These materials may be used or two or more of them may be used in combination. The planarizing organic thin films may be laminated by a known method in the art. For example, the organic materials may be formed by evaporation, silk screen, or coating, and polymerized by ultraviolet rays or visible rays, thereby laminating the planarizing organic thin films.

The conformal organic thin films may be laminated by a known method in the art. For example, the organic materials are formed by evaporation or CVD, and thermopolymerized, thereby laminating the conformal organic thin films.

As the materials of the inorganic thin films and the methods of laminating the inorganic thin films, any materials and any methods may be unlimitedly used.

For example, the materials for the inorganic thin films include silicon nitrides, aluminum nitrides, zirconium nitrides, titanium nitrides, hafnium nitrides, tantalum nitrides, silicon oxides, aluminum oxides, titanium oxides, zirconium oxides, magnesium oxides, tin oxides, cerium oxides, silicon oxynitrides (SiON), and the like. As the methods of laminating the inorganic thin films, vacuum film-forming methods, such as sputtering, CVD, e-beam, thermal deposition, IBAD (Thermal Ion Beam Assisted Deposition), and the like, may be used. The CVD method includes ICP-CVD (Induced Coupled Plasma-Chemical Vapor Deposition), CCP (Capacitively Coupled Plasma)-CVD, SWP (Surface Wave Plasma)-CVD, and the like.

The multi layer encapsulated film according to an embodiment of the invention may be effectively used in fields where the oxygen and moisture barrier properties are required. For example, in view of compact, transparency, and flexibility, it may be used for displays, such as OLED (Organic Light-Emitting Device) and FOLED (Flexible Organic Light-Emitting Device), and batteries, such as a thin film battery and a solar cell.

The multi layer encapsulated film of the invention may be used in various ways. For example, the multi layer encapsulated film may be provided on the surface and the upper portion of the device to seal the device. Alternatively, the multi layer encapsulated film may be formed at the sides and bottom of the substrate, as well as the substrate and the upper portion of the device formed thereon, thereby enclosing and sealing the substrate and the device formed thereon.

The embodiments of the invention will now be described in detail with reference to the drawings.

Figure 5:
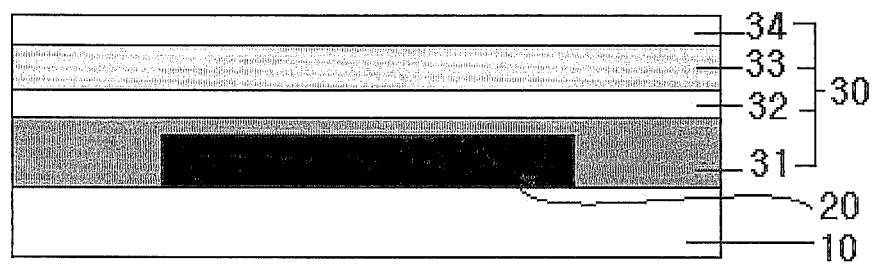
FIG. 5 is a diagram showing a multi layer encapsulated film, in which a planarizing organic thin film, an inorganic thin film, a conformal organic thin film, and an inorganic thin film are laminated in that order, according to an embodiment of the invention.

FIG. 5 shows a multi layer encapsulated film, in which a planarizing organic thin film, an inorganic thin film, a conformal organic thin film, and an inorganic thin film are laminated in that order, according to an embodiment of the invention.

As shown in FIG. 5, a device 20 is mounted on a substrate 10, and a multi layer encapsulated film 30 is formed on the substrate 10 and the device 20 so as to protect the device from oxygen and moisture.

The multi layer encapsulated film 30 includes a planarizing organic thin film 31, an inorganic thin film 32, a conformal organic thin film 33, and an inorganic thin film 34. The planarizing organic thin film 31 is laminated directly on the substrate 10 and the device 20 so as to reduce defects on the substrate and the device, thereby improving the surface roughness. The inorganic thin film 32 is laminated on the planarizing organic thin film 31 so as to substantially serve as a barrier against oxygen and moisture. The conformal organic thin film 33 is laminated on the inorganic thin film 32 so as to supplement the particles not uniformly distributed due to the planarizing organic thin film 31. The inorganic thin film 34 is laminated on the conformal organic thin film 33 so as to substantially serve as a barrier against oxygen and moisture. Accordingly, the multi layer encapsulated film 30 forms a satisfactory primary barrier against oxygen and moisture with the planarizing organic thin film 31, which improves the surface roughness, and the inorganic thin film 32, which is provided uniformly on the planarizing organic thin film 31. In addition, the multi layer encapsulated film 30 forms a satisfactory secondary barrier against oxygen and moisture with the conformal organic thin film 33, which is laminated on the inorganic thin film 32 so as to supplement the particles not uniformly distributed, and the inorganic thin film 34, which is laminated on the conformal organic thin film 33. Therefore, the multi layer encapsulated film can be excellent in oxygen and moisture barrier properties.

Figure 6:
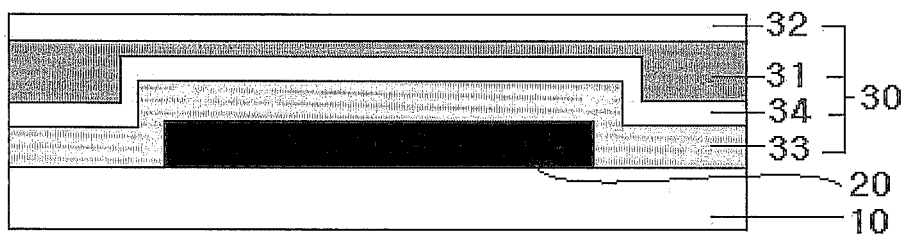
FIG. 6 is a diagram showing a multi layer encapsulated film, in which a conformal organic thin film, an inorganic thin film, a planarizing organic thin film, and an inorganic thin film are laminated in that order, according to another embodiment of the invention.

FIG. 6 shows a multi layer encapsulated film, in which a conformal organic thin film, an inorganic thin film, a planarizing organic thin film, and an inorganic thin film are laminated in that order, according to another embodiment of the invention.

As shown in FIG. 6, a device 20 is mounted on a substrate 10, and a multi layer encapsulated film 30 is laminated on the substrate 10 and the device 20 so as to protect the device from oxygen and moisture.

The multi layer encapsulated film 30 includes a conformal organic thin film 33, an inorganic thin film 34, a planarizing organic thin film 31, and an inorganic thin film 32. The conformal organic thin film 33 is laminated directly on the substrate 10 and the device 20 so as to enable the particles to uniformly cover the device. The inorganic thin film 34 is laminated on the conformal organic thin film 33 so as to substantially serve as a barrier against oxygen and moisture. The planarizing organic thin film 31 is laminated on the inorganic thin film 34 so as to supplement ununiform surface roughness due to the conformal organic thin film 33. The inorganic thin film 32 is laminated on the planarizing organic thin film 33 so as to substantially serve as a barrier against oxygen and moisture.

Accordingly, the multi layer encapsulated film 30 forms a primary barrier against oxygen and moisture with the conformal organic thin film 33, which enables the particles to uniformly cover the device, and the inorganic thin film 34, which is laminated on the conformal organic thin film 33. In addition, the multi layer encapsulated film 30 forms a secondary barrier against oxygen and moisture with the planarizing organic thin film 31, which is laminated on the inorganic thin film 34 so as to improve the surface roughness, and the inorganic thin film 32, which is laminated on the planarizing organic thin film 31. Therefore, the multi layer encapsulated film can have excellent barrier properties against oxygen and moisture.

The invention claimed is:

1. A multi layer encapsulating film comprising:
   at least one planarizing organic thin film;
   at least one conformal organic thin film; and
   at least one inorganic thin film,
   wherein
   the multi layer encapsulating film is on a substrate and on a top of a device that is directly on the substrate, to seal the device, and
   the thin films are laminated in the following sequence:
   a planarizing organic thin film directly on the device,
   a conformal organic thin film directly touching the planarizing organic film, and
   an inorganic thin film directly touching the conformal organic film.

2. The multi layer encapsulating film as set forth in claim 1, wherein at least one planarizing organic thin film or at least one two-layered thin film having a conformal organic thin film and an inorganic thin film in that order is further laminated on the outermost inorganic thin film of the laminated thin films.

3. The multi layer encapsulating film as set forth in claim 1, wherein at least one three-layered thin film having a planarizing organic thin film, a conformal organic thin film, and an inorganic thin film in that order or at least one three-layered thin film having a conformal organic thin film, a planarizing organic thin film, and an inorganic thin film in that order is further laminated on the inorganic thin film of the laminated thin films.

4. The multi layer encapsulating film as set forth in claim 1, wherein at least one planarizing organic thin film or at least one two-layered thin film having a conformal organic thin film and an inorganic thin film in that order is further laminated on the inorganic thin film of the laminated thin films.

5. The multi layer encapsulating film as set forth in claim 1, wherein the planarizing organic thin film comprises one or more materials selected from a group consisting of diazo resin, azide resin, acryl resin, polyamide resin, polyester resin, epoxide resin, polyether resin, and urethane resin, all of which are photopolymerizable.

6. The multi layer encapsulating film as set forth in claim 1, wherein the conformal organic thin film comprises one or more materials selected from a group consisting of polystyrene resin, acryl resin, urea resin, isocyanate resin, and xylene resin, in which radicals are generated by heat and then polymerization is initiated.

7. The multi layer encapsulating film as set forth in claim 1, wherein a material of the inorganic thin film comprises one or more materials selected from a group consisting of silicon nitride, aluminum nitride, zirconium nitride, titanium nitride, hafnium nitride, tantalum nitride, silicon oxide, aluminum oxide, zirconium oxide, magnesium oxide, titanium oxide, tin oxide, cerium oxide, and silicon oxynitride (SiON).

8. The multi layer encapsulating film as set forth in claim 1, wherein at least two inorganic thin films are formed in the multi layer encapsulating film, the inorganic thin films are formed of a same type of inorganic thin film or two or more different types of the inorganic thin films.

9. The multi layer encapsulating film as set forth in claim 1, wherein the planarizing organic thin film is laminated by forming an organic material by way of one or more of evaporation, silk screen, coating, or polymerizing using one or more of ultraviolet rays or visible rays.

10. The multi layer encapsulating film as set forth in claim 1, wherein the conformal organic thin film is laminated by forming an organic material by way of one or more of evaporation, CVD or thermal polymerization.

11. The multi layer encapsulating film as set forth in claim 1, wherein the inorganic thin film is laminated by way of one or more of sputtering, CVD, e-beam, thermal deposition, or IBAD (Thermal Ion Beam Assisted Deposition).

12. The multi layer encapsulating film as set forth in claim 1, wherein the multi layer encapsulating film is on sides and a bottom of the substrate to enclose and seal the substrate and the device.

13. A multi layer encapsulating film comprising:
at least one planarizing organic thin film;
at least one conformal organic thin film; and
at least one inorganic thin film,
wherein
the multi layer encapsulating film is on a substrate and on a top of a device that is directly on the substrate, to seal the device, and
the thin films are laminated in the following sequence:
a conformal organic thin film directly on the device,
a planarizing organic thin film directly touching the conformal organic thin film, and
an inorganic thin film directly touching the planarizing organic thin film.

* * * * *

UNITED STATES PATENT AND TRADEMARK OFFICE
CERTIFICATE OF CORRECTION

PATENT NO. : 9,681,501 B2  Page 1 of 1
APPLICATION NO. : 12/809539
DATED : June 13, 2017
INVENTOR(S) : Nam et al.

It is certified that error appears in the above-identified patent and that said Letters Patent is hereby corrected as shown below:

In the Specification

In Column 4, Line 33, delete "(Induced" and insert -- (Inductively --, therefor.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*